United States Patent
Van De Kerkhof et al.

(10) Patent No.: US 12,372,888 B2
(45) Date of Patent: Jul. 29, 2025

(54) PATTERNING DEVICE CONDITIONING SYSTEM AND METHOD

(71) Applicant: ASML NETHERLANDS B.V., Veldhoven (NL)

(72) Inventors: Marcus Adrianus Van De Kerkhof, Helmond (NL); Ferdinandus Martinus Jozef Henricus Van De Wetering, Eindhoven (NL); Andrei Mikhailovich Yakunin, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/768,881

(22) PCT Filed: Sep. 14, 2020

(86) PCT No.: PCT/EP2020/075611
§ 371 (c)(1),
(2) Date: Apr. 14, 2022

(87) PCT Pub. No.: WO2021/073817
PCT Pub. Date: Apr. 22, 2021

(65) Prior Publication Data
US 2024/0094647 A1    Mar. 21, 2024

(30) Foreign Application Priority Data
Oct. 18, 2019  (EP) .................................... 19203978

(51) Int. Cl.
*G03F 7/00*    (2006.01)
(52) U.S. Cl.
CPC ...... *G03F 7/70933* (2013.01); *G03F 7/70725* (2013.01); *G03F 7/70916* (2013.01); *G03F 7/70983* (2013.01)

(58) Field of Classification Search
CPC ............ G03F 7/70933; G03F 7/70725; G03F 7/70825; G03F 7/70833; G03F 7/70916;
(Continued)

(56) References Cited

U.S. PATENT DOCUMENTS 5,669,979 A     9/1997  Elliott et al.
6,642,531 B1 *  11/2003 Powers ..................... G03F 1/24
                                                          430/5
(Continued)

FOREIGN PATENT DOCUMENTS

CN  102016723    4/2011
CN  102566302    7/2012
(Continued)

OTHER PUBLICATIONS

English translation of DE-102013225006-A1. (Year: 2014).*
(Continued)

*Primary Examiner* — Christina A Riddle
(74) *Attorney, Agent, or Firm* — Pillsbury Winthrop Shaw Pittman, LLP

(57) ABSTRACT

A reticle conditioning system includes: a support structure to support a reticle; a gas supply module to provide a flow of gas adjacent to the reticle; and a biasing module to control an electrical potential of the reticle. The biasing module includes a first electrode, a second electrode and a voltage supply. The first and second electrodes are each spaced apart from and facing the reticle, when the reticle is supported by the support structure, so as to at least partially overlap with the reticle. The voltage supply is arranged to maintain the first electrode at a positive voltage, and the second electrode at a negative voltage, these voltages being such that the voltage of the reticle is negative. The second electrode is
(Continued)

disposed such that, when the reticle is supported by the support structure, it does not overlap an image forming portion of the reticle.

20 Claims, 5 Drawing Sheets

(58) Field of Classification Search
CPC ............... G03F 7/70983; G03F 7/70; G03F 7/70908–7095; G03F 7/70958; G03F 7/70975; G03F 1/62; G03F 1/64
USPC ........ 355/18, 30, 52–55, 67–77, 133; 430/5; 250/492.1–492.23, 493.1, 503.1, 504 R, 250/505.1, 515.1
See application file for complete search history.

(56) References Cited

U.S. PATENT DOCUMENTS

| | | | |
|---|---|---|---|
| 7,367,138 B2 | 5/2008 | Sogard | |
| 8,477,472 B2 | 7/2013 | Hansen | |
| 2002/0096647 A1* | 7/2002 | Moors | G03F 7/7085 250/492.1 |
| 2006/0077361 A1 | 4/2006 | Sogard | |
| 2007/0079525 A1 | 4/2007 | Sogard | |
| 2009/0128795 A1 | 5/2009 | Hayashi | |
| 2011/0037960 A1* | 2/2011 | Scaccabarozzi | G03F 7/70925 355/30 |
| 2012/0140198 A1 | 6/2012 | Amin-Shahidi | |
| 2013/0235357 A1 | 9/2013 | Delgado et al. | |
| 2016/0207078 A1 | 7/2016 | Kelly | |
| 2018/0164694 A1* | 6/2018 | Kim | G03F 7/2063 |
| 2019/0056654 A1 | 2/2019 | Peter et al. | |
| 2023/0073062 A1* | 3/2023 | Chen | G03F 7/70916 |
| 2023/0280666 A1* | 9/2023 | Li | G03F 7/70925 250/504 R |

FOREIGN PATENT DOCUMENTS

| | | | |
|---|---|---|---|
| DE | 102004010002 | 9/2005 | |
| DE | 102013225006 A1 * | 10/2014 | ............... G03F 1/24 |
| JP | H04172453 | 6/1992 | |
| JP | H06168864 | 6/1994 | |
| JP | 2007329288 A * | 12/2007 | |
| KR | 2009-0052274 | 5/2009 | |
| KR | 2018-0072786 | 6/2018 | |
| TW | 201120582 | 6/2011 | |
| WO | 2009129960 | 10/2009 | |
| WO | 2019/048987 | 3/2019 | |

OTHER PUBLICATIONS

English translation of JP2007-329288, published on Dec. 20, 2007. (Year: 2007).*
Transmittal of International Preliminary Report on Patentability and Written Opinion issued in corresponding Patent Application No. PCT/EP2020/078350, dated May 5, 2022.
International Search Report and Written Opinion issued in corresponding PCT Patent Application No. PCT/EP/2020/075611, dated Dec. 8, 2020.
Office Action issued in corresponding Taiwanese Patent Application No. 109135092, dated May 31, 2024.
Office Action issued in corresponding Korean Patent Application No. 10-2022-7012032, dated May 30, 2025.

* cited by examiner

PATTERNING DEVICE CONDITIONING SYSTEM AND METHOD

CROSS-REFERENCE TO RELATED APPLICATIONS

This application is the U.S. national phase entry of PCT Patent Application No. PCT/EP2020/075611 filed Sep. 14, 2020, which claims the benefit of priority of European Patent Application No. Serial No. 19203978.2 which was filed on Oct. 18, 2019 and which is incorporated herein in its entirety by reference.

FIELD

The present invention relates to a patterning device conditioning system and an associated method. In particular, it relates to a system for supporting a patterning device (within a lithographic apparatus) and is arranged to reduce the chance that particles will be incident on the patterning device while it is so supported. The present invention also relates to an associated method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask or reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The electromagnetic radiation is used to form an image of the patterning device on the substrate. It is important that the patterning device remains as free as possible from contaminating particles since any such particles may affect the image that is formed on the substrate. It may be desirable to provide a system for supporting a patterning device within the lithographic apparatus that is arranged to reduce the chance (for example relative to existing systems) that particles will be incident on the patterning device while it is so supported.

It may be desirable to at least partially address one or more problems associated with prior art systems whether discussed herein or otherwise.

SUMMARY

According to a first aspect of the invention there is provided a patterning device conditioning system for a lithographic apparatus, the patterning device conditioning system comprising: a support structure for supporting a patterning device, the support structure comprising a first portion for supporting an image forming portion of the patterning device and a second portion for supporting a non-image forming portion of the patterning device; a gas supply module operable to provide a flow of gas adjacent to the support structure; and a biasing module for controlling an electrical potential of a patterning device when supported by the support structure, the biasing module comprising a first electrode, a second electrode and a voltage supply; wherein the first and second electrodes are each spaced apart from and facing the support structure so as to at least partially overlap with the support structure; wherein the voltage supply is arranged to maintain the first electrode at a first, positive voltage, and to maintain the second electrode at a second, negative voltage; and wherein the second electrode is disposed such that it at least partially overlaps the second portion of the support structure and does not overlap the first portion of the support structure.

In use, a patterning device may be supported by the support structure and may be irradiated by radiation (for example EUV radiation) so as to form an image of the patterning device on a substrate (for example a resist covered silicon wafer). It may be desirable to prevent particles from contacting the patterning device since this can lead to imaging errors.

The patterning device conditioning system according to the first aspect of the invention is advantageous, as now discussed.

First, the flow of gas may act to reduce the chance of particles contacting the patterning device since such particles may become entrained in the gas flow and transported away from the patterning device. However, in use, when the patterning device is exposed to radiation the radiation may cause the gas to form a plasma. As such particles move through the plasma they tend to become negatively charged (since electrons in the plasma have a higher mobility than ions in the plasma). Furthermore, in use, when the patterning device is exposed to radiation the patterning device may become slightly positively charged due to the photoelectric effect. As a result, there may be a biasing force on such particles towards the patterning device, which is undesirable.

A patterning device supported by the support structure may generally comprise a central image forming portion surrounded by a non-image forming portion. The image forming portion may comprise both reflective and non-reflective parts arranged in a pattern. In use, radiation may be reflected by the image forming portion, which may serve to form a patterned radiation beam. A projection system may be used to form a (resolution-limited) image of the image forming portion of the patterning device on a substrate. The potential of the patterning device may be floating (for example the patterning device may be electrically isolated from the support structure).

Naively, one may consider a simple arrangement whereby a single biasing electrode is provided facing the patterning device with, for example, a positive biasing voltage in order to attract the negatively charged particles towards the single biasing electrode and away from the patterning device. However, due to the presence of the plasma, such an arrangement, the plasma would provide a conductive link between the single biasing electrode and the patterning device. As a result, the floating patterning device would be pulled to the same potential as the single biasing electrode and there would be no biasing field acting on the negatively charged particles.

In contrast, the biasing module of the patterning device conditioning system according to the first aspect of the invention uses two biasing electrodes. Both of the first and second electrodes have a capacitive coupling with a patterning device supported by the support structure. The first electrode is effectively urging the voltage of the patterning device towards the first, positive voltage and the second electrode is effectively urging the voltage of the patterning device towards the second, negative voltage. The result of this arrangement is that the patterning device tends to an intermediate voltage between the first, positive voltage and the second, negative voltage. The intermediate voltage may be considered to be a weighted average of the first and second voltages, the weighting being determined by the capacitive couplings of the two electrodes to the patterning device. It will be appreciated that the capacitive couplings of each of the electrodes to the patterning device is dependent on an area of the electrode which overlaps the patterning device and a separation between the electrode and the patterning device (and the permittivity of the medium disposed between the electrode and the patterning device). It will be appreciated that by suitable selection of these parameters and of the first and second voltages, it can be ensured that the voltage of the patterning device (also referred to as the intermediate voltage) is negative.

The first, positive voltage and the second, negative voltage may be such that the voltage of the patterning device is negative.

It will be appreciated that on a surface of the first electrode (which is maintained at the first, positive voltage) there will be induced a positive surface charge density and that on a portion of the patterning device which overlaps the first electrode there will be induced a generally equal and opposite negative surface charge density. Any negative charges disposed between the first electrode and the patterning device (for example entrained in the gas flow) will therefore tend to be biased towards the first electrode and away from the patterning device. This is advantageous since it keeps such particles away from the patterning device.

Similarly, it will be appreciated that on a surface of the second electrode (which is maintained at the second, negative voltage) there will be induced a negative surface charge density and that on a portion of the patterning device which overlaps the second electrode there will be induced a generally equal and opposite positive surface charge density. Any negative charges disposed between the second electrode and the patterning device (for example entrained in the gas flow) will therefore tend to be biased away from the second electrode and towards the patterning device. However, the second electrode is disposed such that it overlaps the second portion of the support structure, i.e. the portion of the support structure that, in use, supports a non-image forming portion of the patterning device. Therefore, although such particles are urged towards the patterning device, they are urged towards the non-image forming portion of the patterning device and will therefore not affect the image formed on the substrate.

Any negative charges disposed adjacent to the patterning device (for example entrained in the gas flow) which are not between the first electrode and the patterning device or between the second electrode and the patterning device will also tend to be biased away from the patterning device, since it is maintained at a negative intermediate voltage (provided that it is sufficiently far from the region of patterning device which overlaps with the second electrode on which the negative charge density is induced).

Therefore, the patterning device conditioning system according to the first aspect of the invention is advantageous because the gas supply module can provide a flow of gas which can act to transport particles away from the patterning device. At the same time, the biasing module is arranged to generally bias negatively charged particles entrained in this gas flow away from all parts of the patterning device except for a portion of the non-imaging portion of the patterning device.

The flow of gas provided adjacent to the support structure by the gas supply module is generally parallel to a surface of the patterning device and may be referred to as a cross-flow.

The patterning device conditioning system may further comprise a scanning module operable to move the support structure in a scanning direction between at least a first end position and a second end position.

Such a scanning module may be used to perform a dynamic scanning exposure. For example, the scanning module may be operable to move the support structure in the scanning direction relative to a supporting frame (which the support structure may be considered to be movable mounted to). The gas supply module and the biasing module may also be mounted on the supporting frame. The gas supply module and the biasing module may be fixed relative to the supporting frame or at least movable relative thereto independently of the support structure such that when the support structure moves, the gas supply module and the biasing module may remain fixed.

It will be appreciated that for such embodiments comprising a scanning module, the second electrode may be disposed such that it overlaps the second portion of the support structure but does not overlap the first portion of the support structure for at least part of the range of positions between the first end position and the second end position.

The movement of the support structure between the first and second positions may define an extended first portion region of the support structure (defined by all of the regions that the first portion of the support structure can be disposed in) and an extended second portion region of the support structure.

The second electrode may be disposed such that it at least partially overlaps the second portion of the support structure and does not overlap the first portion of the support structure when the support structure is disposed in the first end position, the second end position or any position therebetween.

With such an arrangement, the second electrode may be considered to overlap a fixed, non-critical defectivity area. For example, the second electrode may comprise one or more extended electrodes which extend in a non-scanning direction (which is perpendicular to the scanning direction).

The first electrode may be disposed such that it at least partially overlaps the first portion of the support structure.

It will be appreciated that for embodiments comprising a scanning module operable to move the support structure, the first electrode may be disposed such that it at least partially overlaps the first portion of the support structure for at least part of the range of positions between the first end position and the second end position.

The first electrode may comprise a plurality of first electrode elements.

The first electrode elements may be arranged such that for any position in a range of positions between the first end position and the second end position at least one of the first electrode elements at least partially overlaps the support structure.

The at least one of the first electrode elements may at least partially overlap the first portion of the support structure.

The voltage supply may be arranged to control a voltage of each of the first electrode elements in dependence on a position of the support structure.

The second electrode may comprise a plurality of second electrode elements, wherein each of the second electrode elements may be disposed such that it at least partially overlaps the second portion of the support structure and does not overlap the first portion of the support structure.

The second electrode may comprise two second electrode elements, each of the second electrode elements extending in a non-scanning direction which is perpendicular to the scanning direction. For example, the two second electrode elements may extend along an extended second portion region of the support structure adjacent to an extended first portion region of the support structure.

The voltage supply may be arranged to control a voltage of each of the second electrode elements in dependence on a position of the support structure.

The first, positive voltage and the second, negative voltage may be such that a magnitude of the voltage of the patterning device is less than 50 V.

It will be appreciated that if the voltage of the patterning device is negative then when the magnitude of the voltage of the patterning device is less than 50 V, the voltage of the patterning device is between −50 V and 0 V. For example, the applied voltages may such that the magnitude of the voltage of the patterning device is less than 20 V, for example of the order of 10 V.

Maintaining the voltage of the patterning device at a relatively small but negative voltage may provide a beneficial biasing of negatively charged particles away from the image formation portion of the patterning device whilst reducing the level of currents through (relatively thin) conductive film on the patterning device. Advantageously, this can reduce heating and/or damage of the patterning device. Furthermore, once the voltages are removed from the first and second electrodes, the biasing voltage that has been induced on the patterning device may remain. By keeping this voltage low (for example below 50 V) the chances of this voltage arcing or shorting with other metal components is reduced.

One or more of the first and second electrodes may be provided on a patterning device masking blade, an edge of the patterning device masking blades defining a portion of a perimeter of a field region on the patterning device.

One or more of the first and second electrodes may be provided on a portion of the gas supply module.

Alternatively, one or more of the first and second electrodes may be provided on any other component within a lithography apparatus.

According to a second aspect of the invention there is provided an assembly comprising: the patterning device conditioning system according to the first aspect of the invention; and a patterning device supported by the support structure.

The patterning device may comprise a reticle.

The patterning device may be provided with a pellicle.

According to a third aspect of the invention there is provided a lithographic apparatus comprising: an illumination system operable to output a radiation beam; the patterning device conditioning system of the first aspect of the invention, wherein the radiation beam output by the illumination system is directed to the support structure so that a patterning device supported by the support structure can impart a pattern in the cross-section of the radiation beam, forming a patterned radiation beam; a substrate table for supporting a substrate; and a projection system for projecting the patterned radiation beam onto a target region of the substrate so as to form an image on the substrate.

According to a fourth aspect of the invention there is provided a method for conditioning a patterning device within a lithographic apparatus, the method comprising: supporting the patterning device; providing a flow of gas adjacent to the patterning device; providing first and second electrodes that are each spaced apart from and facing the patterning device so as to at least partially overlap with the patterning device wherein the second electrode is disposed such that it at least partially overlaps a non-image forming portion of the patterning device and does not overlap an imaging portion of the patterning device; and maintaining the first electrode at a first, positive voltage and maintaining the second electrode at a second, negative voltage such that the voltage of the patterning device is negative. The provision of a flow of gas may act to reduce the chance of particles contacting the patterning device since such particles may become entrained in the gas flow and transported away from the patterning device.

The method according to the fourth aspect of the invention uses two biasing electrodes. Both of the first and second electrodes have a capacitive coupling with the patterning device and can be used to generally bias negatively charged particles entrained in the gas flow away from all parts of the patterning device except for a portion of the non-imaging portion of the patterning device.

According to a fifth aspect of the invention there is provided a method for conditioning a patterning device having a pellicle assembly within a lithographic apparatus, the method comprising: supporting the patterning device; providing a flow of gas adjacent to the patterning device; providing first and second electrodes that are each spaced apart from and facing the patterning device so as to at least partially overlap with the patterning device wherein the second electrode is disposed such that it at least partially overlaps a portion of the patterning device and does not overlap the pellicle assembly and wherein the first electrode is disposed such that it at least partially overlaps the pellicle assembly; and maintaining the first electrode at a first, positive voltage and maintaining the second electrode at a second, negative voltage such that the voltage of the patterning device is negative and a voltage of the pellicle is positive.

The methods of the fourth and fifth aspects of the invention may further comprise moving the support structure in a scanning direction between at least a first end position and a second end position. The first, positive voltage and/or the second, negative voltage the voltage supply may be controlled in dependence on a position of the patterning device.

At least part of the methods of the fourth and fifth aspects of the invention may be carried our using the patterning device conditioning system of the first aspect of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
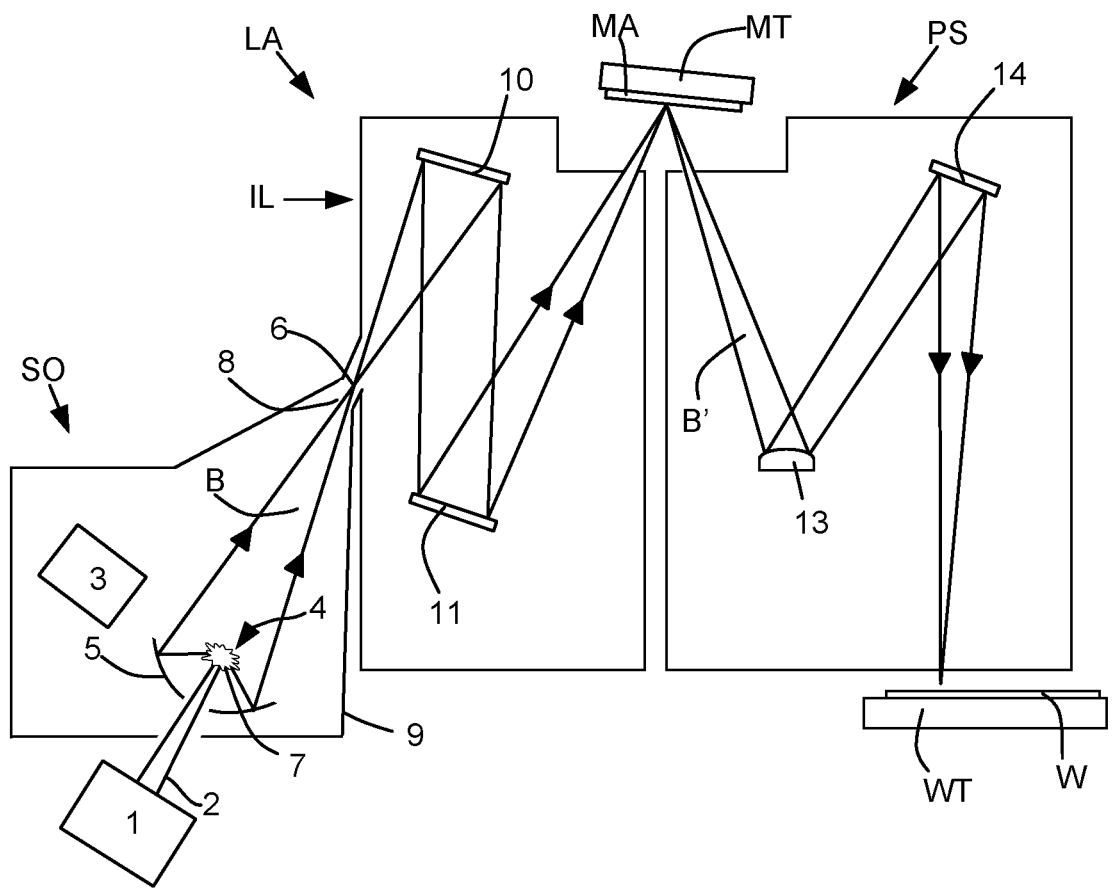
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Embodiments of the present invention relate to a patterning device conditioning system for supporting the patterning device MA within the lithographic apparatus LA. The patterning device conditioning system is arranged to reduce the chance that particles will be incident on the patterning device MA while it is so supported, as now discussed.

Figure 2:
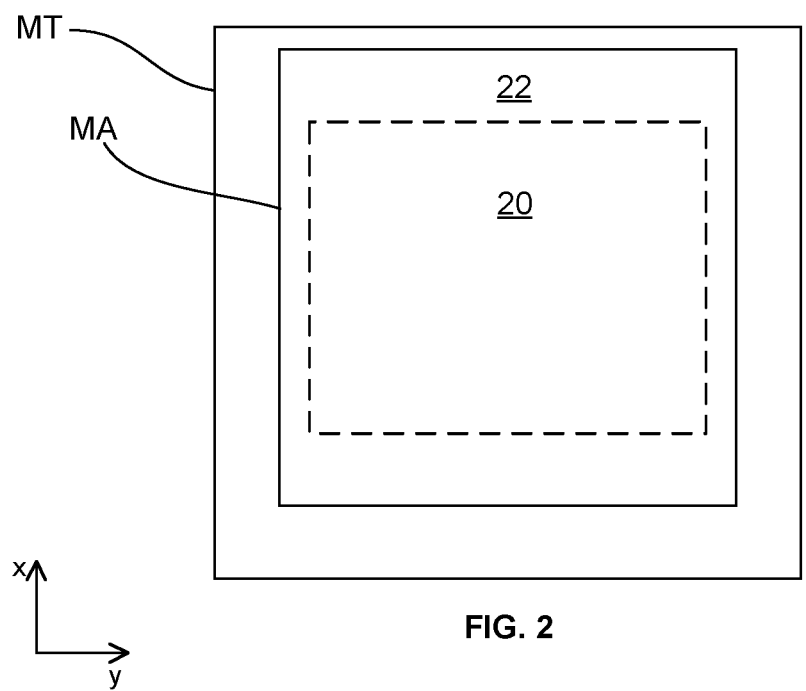
FIG. 2 is a schematic plan view of a support structure that forms part of the lithographic apparatus shown in FIG. 1 and a patterning device supported by the support structure.

As shown schematically in FIG. 2, the patterning device MA, which is supported by the support structure MT may generally comprise a central image forming portion 20 surrounded by a non-image forming portion 22. The image forming portion 20 may comprise both reflective and non-reflective parts arranged in a pattern. In use, the radiation beam B is reflected by the image forming portion 20, which may serve to form the patterned radiation beam B'. The whole patterning device MA may be provided with a (relatively thin) conductive coating, which in general covers both the central image forming portion 20 and the non-image forming portion 22. The potential of the patterning device MA (and, in particular, the conductive coating) may be floating (for example the patterning device MA may be electrically isolated from the support structure MT).

It will be appreciated that since the support structure MT supports the patterning device MA, the support structure MT may be considered to comprise a first portion for supporting the image forming portion 20 of the patterning device MA (which coincides with the image forming portion 20 in FIG. 2) and a second portion for supporting the non-image forming portion 22 of the patterning device MA (which coincides with the image forming portion 20 in FIG. 2).

Figure 3A:
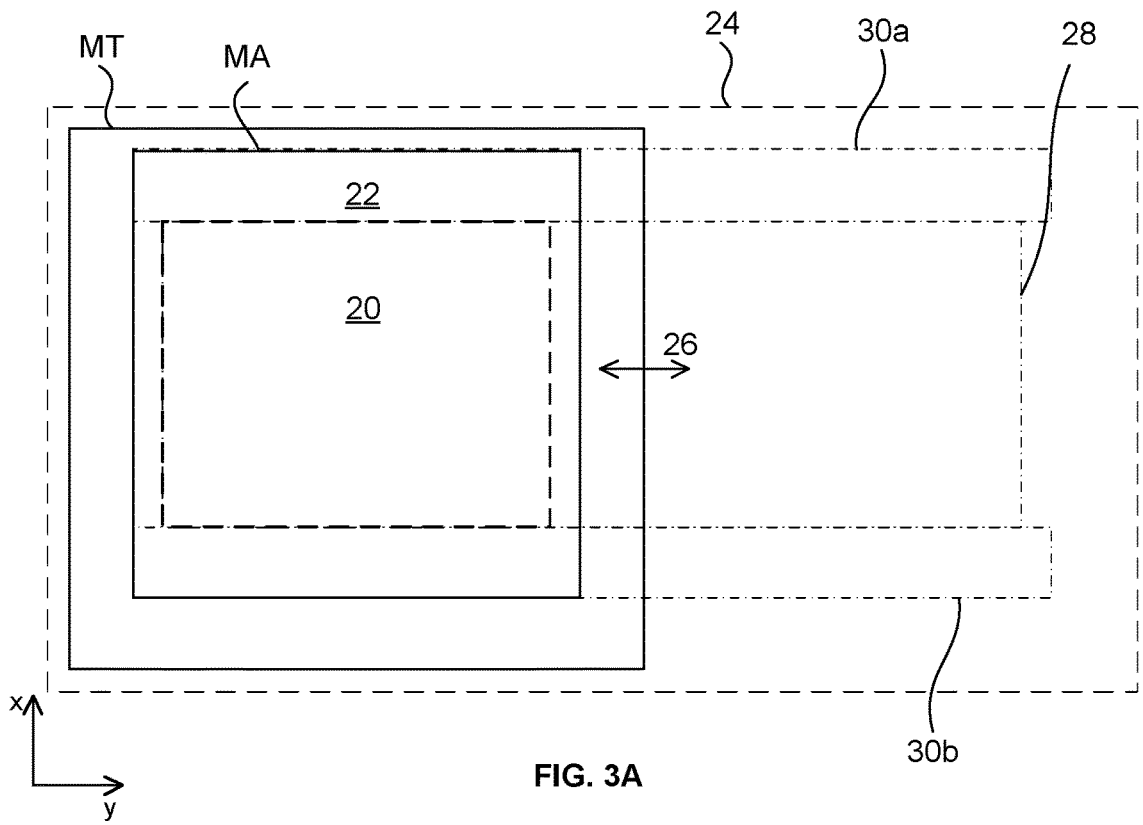
FIG. 3A is a schematic plan view of the support structure and patterning device shown in FIG. 2 disposed in a first end position.
Figure 3B:
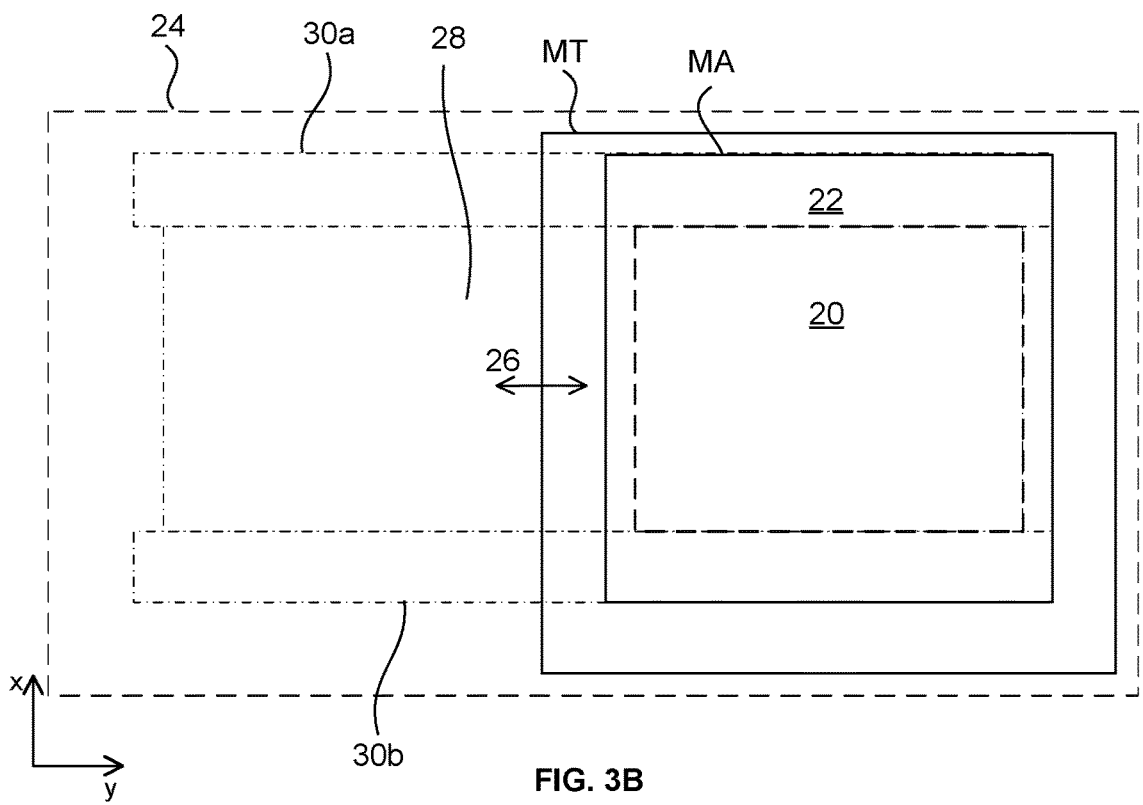
FIG. 3B is a schematic plan view of the support structure and patterning device shown in FIG. 2 disposed in a second end position.

The support structure MT may be movable in a scanning direction so as to expose a greater region of the patterning device MA in a single dynamic scanning exposure, as now discussed with reference to FIGS. 3A and 3B. FIGS. 3A and 3B show a schematic plan view of the support structure MT and the patterning device MA in two different positions.

The support structure MT is movably mounted within a region 24. In particular, the support structure MT is movable in a scanning direction, as indicated by arrow 26, between a first end position (as shown in FIG. 3A) and a second end position (as shown in FIG. 3B).

Unless stated otherwise, throughout this specification, the following set of Cartesian co-ordinates will be used. The scanning direction is labelled as the y-direction. A direction which is also in the plane of the support structure MT and is perpendicular to the scanning direction is referred to as the non-scanning direction and is labelled as the x-direction. A direction which is perpendicular to the plane of the support structure MT is labelled as the z-direction.

The lithographic apparatus LA may be considered to comprise a scanning module operable to move the support structure MT in the scanning direction between at least the first end position and the second end position. For example, the scanning module may be operable to move the support structure MT in the scanning direction relative to a supporting frame (indicated schematically by region 24), which the support structure MT may be considered to be movable mounted to.

The movement of the support structure MT between the first and second positions defines an extended first portion region 28 of the support structure MT defined by all of the regions that the first portion of the support structure MT (or, equivalently, the image forming portion 20 of the patterning device MA) can be disposed in. That is, the extended first portion region 28 of the support structure MT is a region defined by moving the first portion of the support structure MT (or, equivalently, the image forming portion 20 of the patterning device MA) from the first end position (as shown in FIG. 3A) to the second end position (as shown in FIG. 3B).

The movement of the support structure MT between the first and second positions also defines an extended second portion region of the support structure. The extended second portion region of the support structure MT may be defined by all of the regions that the first portion of the support structure MT (or, equivalently, the image forming portion 20 of the patterning device MA) cannot be disposed in. The extended second portion region of the support structure MT comprises two extended non-critical regions 30a, 30b.

Figure 4A:
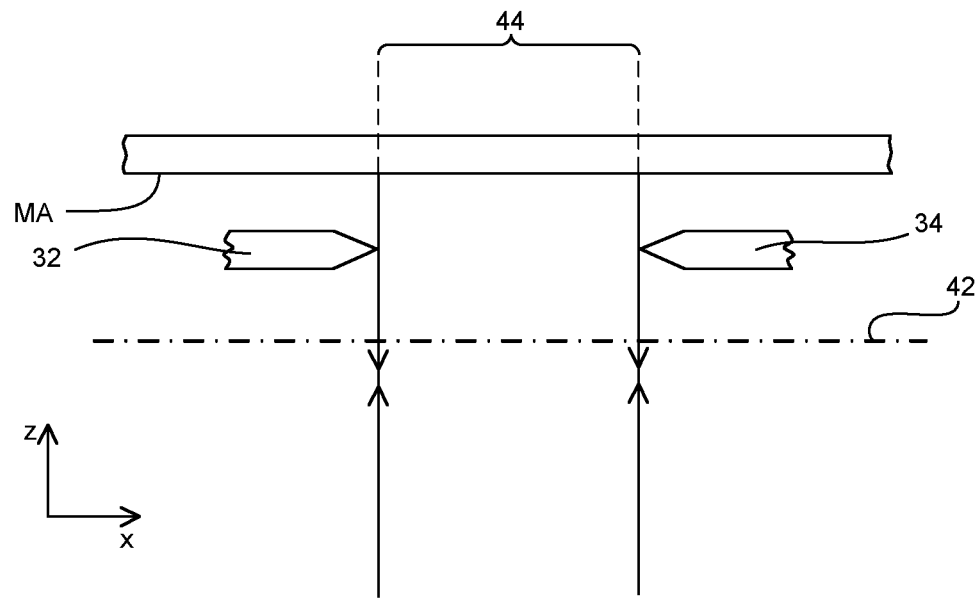
FIG. 4A is a schematic illustration of a first cross section through a patterning device on the support structure and reticle masking blades of the lithographic apparatus of FIG. 1.

The lithographic apparatus LA is provided with four reticle masking blades, which define the extent of the field on the patterning device MA which is illuminated, as now described with reference to FIGS. 4A, 4B and 5. The illumination system IL is operable to illuminate a region of the patenting device MA when disposed on the support structure MT. This region may be referred to as the slit of the illumination system IL and is at least partially defined by four reticle masking blades, which define a generally rectangular region of the patterning device which can receive radiation. The extent of the generally rectangular region in a first direction, which may be referred to as the x direction, is defined by a pair of x masking blades 32, 34. The extent of the generally rectangular region in a second direction, which may be referred to as the y direction, is defined by a pair of y masking blades 36, 38.

Each of the masking blades 32, 34, 36, 38 is disposed close to, but slightly out of the plane of the patterning device on the support structure MT. The x masking blades 32, 34 are disposed in a first plane 40 and the y masking blades 36, 38 are disposed in a second plane 42.

Each of the masking blades 32, 34, 36, 38 defines one edge of a rectangular field region 44 in the plane of the patterning device MA which can receive radiation. In practice the illumination system IL may only illuminate part of the rectangular field region 44. As shown in FIG. 5, the illumination system IL may be arranged to illuminate a curved slit region 46, which may coincide with a part of the rectangular field region 44 (depending on the positions of the y masking blades 36, 38). Each blade may be independently movable between a retracted position wherein it is not disposed in the path of the radiation beam and an inserted position wherein it at least partially blocks the radiation beam projected onto the patenting device MA by the illumination system IL. By moving the masking blades 32, 34, 36, 38 into the path of the radiation beam, the radiation beam B can be truncated (in the x and/or y direction) thus limiting the extent of the field region 44 which receives radiation beam B.

The x-direction corresponds to the non-scanning direction of the lithographic apparatus LA and the y-direction corresponds to the scanning direction of the lithographic apparatus LA. The patenting device MA is movable in the y-direction through the field region 44 (as indicated by again by arrow 26) so as to expose a greater region of the patenting device MA in a single dynamic scanning exposure.

During a dynamic exposure of a target region of a substrate W the target region is moved through an exposure region in the plane of the substrate W, the exposure region being a portion of the substrate W that the exposure region 44 of the patterning device MA is imaged onto by projection system PS. As the target region of the substrate W moves into the exposure region, the first masking blade 36, 38 moves such that only the target region receives radiation (i.e. no parts of the substrate outside of the target region are exposed). At the start of the scanning exposure one of the y masking blades 36, 38 is disposed in the path of the radiation beam B, acting as a shutter, such that no part of the substrate W receives radiation. At the end of the scanning exposure the other y masking blade 36, 38 is disposed in the path of the radiation beam B, acting as a shutter, such that no part of the substrate W receives radiation.

Rays of radiation beam B are shown adjacent to each of the masking blades 32, 34, 36, 38. It will be appreciated that each point in the slit region 46 is illuminated with radiation from a range of angles. For example, each point in the slit region 46 may receive a cone of radiation. The rays of radiation beam B are shown adjacent to each of the masking blades 32, 34, 36, 38 indicate an average direction of the radiation received by the patterning device MA. As can be seen from FIGS. 4A and 4B, in this embodiment, as projected onto the x-z plane, radiation is generally normally incident on the patterning deice MA whereas as projected onto the y-z plane, radiation is generally incident on the patterning deice MA at an angle 48.

The lithographic apparatus LA further comprises a gas nozzle 50, which is arranged to direct a flow of gas 52 adjacent to the support structure MT. In particular, the flow of gas 52 provided adjacent to the support structure MT by the gas nozzle 50 is generally parallel to a surface of the patterning device MA and may be referred to as a cross-flow. The gas nozzle 50 is disposed generally in the same plane (the first plane 40) as the x masking blades 32, 34. The gas nozzle points in the scanning direction such that the flow of gas 52 is generally parallel to the scanning direction and flows between the x masking blades 32, 34. The gas nozzle 50 may be considered to form part of a gas supply module which is operable to provide a flow of gas adjacent to the support structure MT.

Figure 4B:
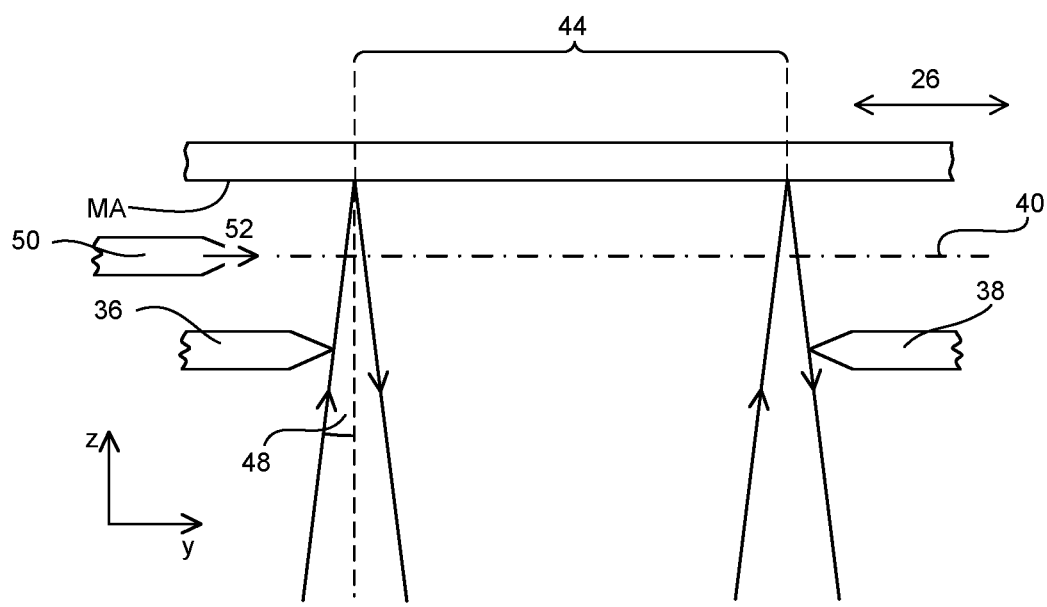
FIG. 4B is a schematic illustration of a second cross section through a patterning device on the support structure and reticle masking blades of the lithographic apparatus of FIG. 1.
Figure 5:
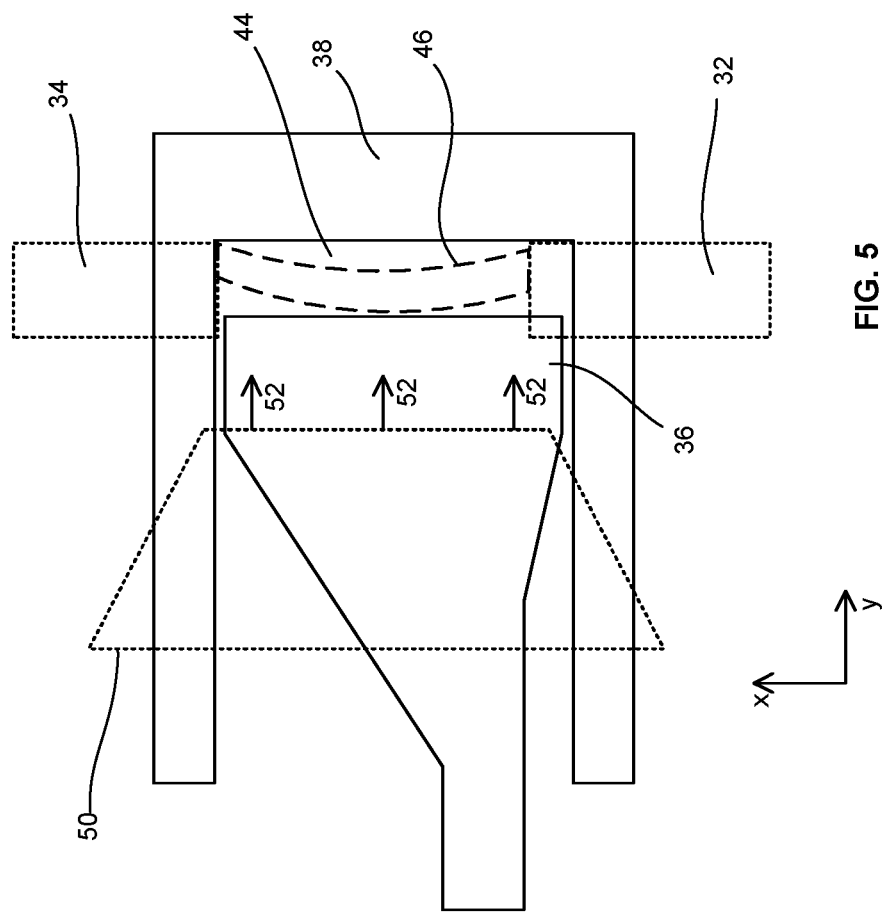
FIG. 5 is a plan view showing the y masking blades and the x masking blades (dotted lines) of the lithographic apparatus of FIG. 1 in a first configuration.

FIG. 5 shows a plan view of the y masking blades 36, 38 in the second plane 42 as viewed in the positive z-direction (i.e. upwards in FIG. 4B). The position of the x masking blades 32, 34 and the gas nozzle (which are disposed in the first plane 40) are shown in dotted lines. In FIG. 5, the four masking blades 32, 34, 36, 38 are disposed so as to define a generally rectangular field region 44, the slit region 46 being disposed within this generally rectangular field region 44. This may be a typical configuration of the four masking blades 32, 34, 36, 38 during the exposure of a central portion of a target region (for example a die on a substrate W). As explained above, each of the x masking blades 32, 34 is operable to move in the x direction and each of the y masking blades 36, 38 is operable to move in the y direction to control the size of the field region 44. The y masking blades 36, 38 are configured such that they can be actuated from the same side of the field region 44. To achieve this, the y masking blades 36, 38 are shaped such that (although they lie in substantially the same plane 42) each of the y masking blades 36, 38 is provided with one or more support portions which extend in the same direction (the negative y direction in FIG. 5).

The masking blades 32, 34, 36, 38 and the gas nozzle 50 may be mounted on a common masking blade assembly support (not shown). It will be appreciated that the masking blades 32, 34, 36, 38 may be movably mounted on such a support such that they can move relative thereto. The gas nozzle may be statically mounted on such a support.

It may be desirable to prevent particles from contacting the patterning device MA since this can lead to imaging errors in the image formed on the substrate W.

Figure 6A:
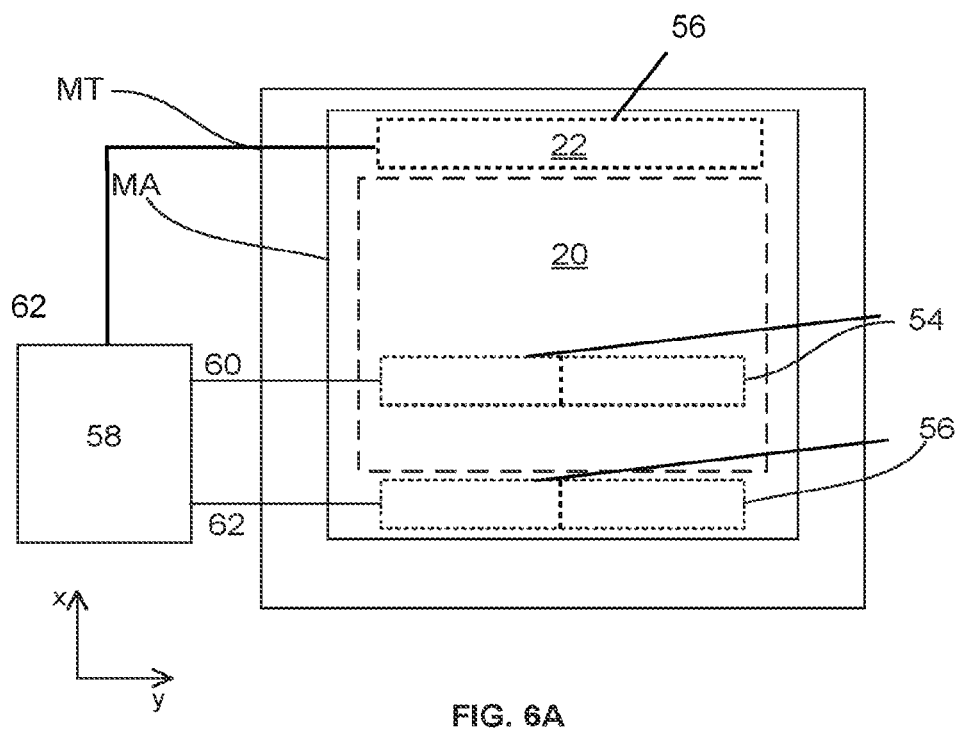
FIG. 6A is a schematic plan view of an apparatus comprising a support structure (shown supporting a patterning device) and a biasing module and for controlling an electrical potential of the patterning device when supported by the support structure.

Embodiments of the present invention relate to apparatus comprising a biasing module for controlling an electrical potential of the patterning device MA when supported by the support structure MT, as now discussed with reference to FIGS. 6A and 6B. The biasing module comprises a first electrode 54, a second electrode 56 and a voltage supply 58.

Figure 6B:
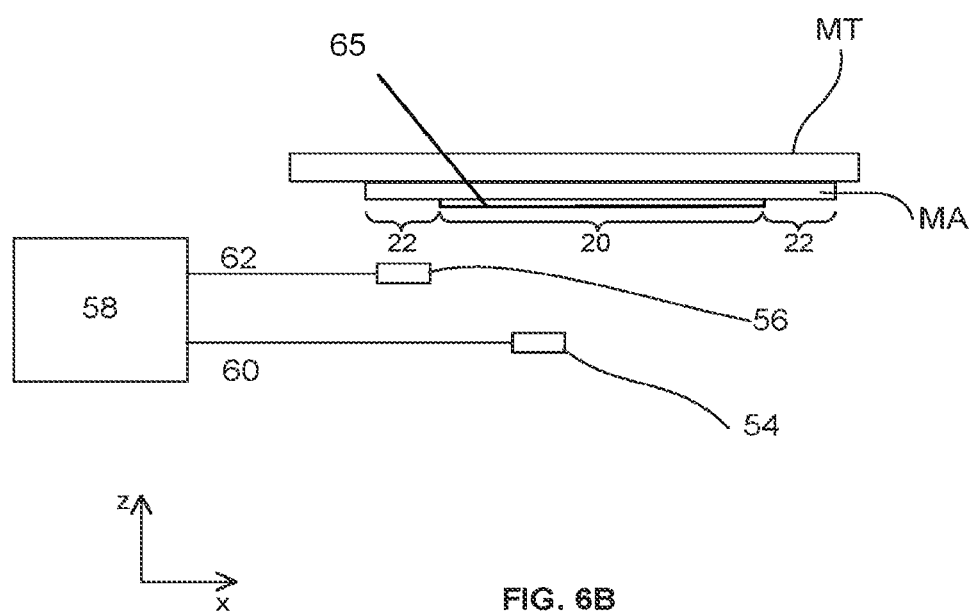
FIG. 6B shows a cross sectional view of an apparatus and supported patterning device shown in FIG. 6A.

As can be best seen in FIG. 6B, the first and second electrodes 54, 56 are each spaced apart from and facing the support structure MT so as to at least partially overlap with the support structure MT and the patterning device MA supported thereby. In FIG. 6A, which shows a plan view of the support structure MT and the patterning device MA, the position of the electrodes is indicated by dotted lines.

The voltage supply 58 is in electrical connection with each of the first and second electrodes 54, 56, as indicated by lines 60, 62 respectively. The voltage supply 58 is operable to control a voltage of each of the first and second electrodes 54, 56. In particular, the voltage supply 56 is arranged to maintain the first electrode 54 at a first, positive voltage, and to maintain the second electrode 56 at a second, negative voltage.

The first, positive voltage and the second, negative voltage are such that the voltage of the patterning device is negative.

The second electrode 56 (which is maintained at a negative voltage by the voltage supply is disposed such that it at least partially overlaps the non-image forming portion 22 of the patterning device MA and does not overlap the image forming portion 20 of the patterning device MA.

Such a biasing module, in combination with a gas supply module (which may, for example, comprise the gas nozzle 50 described above) is particularly advantageous, as now discussed. The biasing module, the gas supply module (which may, for example, comprise the gas nozzle 50 described above) and the support structure may be considered to form a patterning device conditioning system (for example, for lithographic apparatus LA).

Advantageously, the flow of gas 52 from the gas nozzle 50 may act to reduce the chance of particles contacting the patterning device MA since such particles may become entrained in the gas flow 52 and transported away from the patterning device MA. However, in use, when the patterning device MA is exposed to the radiation beam B, the radiation may cause the gas 52 to form a plasma. As such particles move through the plasma they tend to become negatively charged (since electrons in the plasma have a higher mobility than ions in the plasma). Furthermore, in use, when the patterning device MA is exposed to radiation the patterning device MA may become slightly positively charged due to the photoelectric effect. As a result, there may be a biasing force on such particles towards the patterning device MA, which is undesirable.

Naively, one may consider a simple arrangement whereby a single biasing electrode is provided facing the patterning device MA with, for example, a positive biasing voltage in order to attract the negatively charged particles towards the single biasing electrode and away from the patterning device MA. However, due to the presence of the plasma, such an arrangement, the plasma would provide a conductive link between the single biasing electrode and the patterning device MA. As a result, the floating patterning device MA would be pulled to the same potential as the single biasing electrode and there would be no biasing field acting on the negatively charged particles.

In contrast, the biasing module described above with reference to FIGS. 6A and 6B uses two biasing electrodes 54, 56. Both of the first and second electrodes 54, 56 have a capacitive coupling with the patterning device MA supported by the support structure MT. The first electrode 54 is effectively urging the voltage of the patterning device MA towards the first, positive voltage and the second electrode 56 is effectively urging the voltage of the patterning device MA towards the second, negative voltage. The result of this arrangement is that the patterning device MA tends to an intermediate voltage between the first, positive voltage and the second, negative voltage. The intermediate voltage may be considered to be a weighted average of the first and second voltages, the weighting being determined by the capacitive couplings of the two electrodes 54, 56 to the patterning device MA. It will be appreciated that the capacitive couplings of each of the electrodes 54, 56 to the patterning device MA are dependent on an area of the electrode 54, 56 which overlaps the patterning device MA and a separation between the electrode 54, 56 and the patterning device MA (and the permittivity of the medium disposed between the electrode 54, 56 and the patterning device MA). It will be appreciated that by suitable selection of these parameters and of the first and second voltages, it can be ensured that the voltage of the patterning device MA (also referred to as the intermediate voltage) is negative.

It will be appreciated that on a surface of the first electrode 54 (which is maintained at the first, positive voltage) there will be induced a positive surface charge density and that on a portion of the patterning device MA which overlaps the first electrode 54 there will be induced a generally equal and opposite negative surface charge density. Any negative charges disposed between the first electrode 54 and the patterning device MA (for example entrained in the gas flow) will therefore tend to be biased towards the first electrode 54 and away from the patterning device MA. This is advantageous since it keeps such particles away from the patterning device MA.

Similarly, it will be appreciated that on a surface of the second electrode 56 (which is maintained at the second, negative voltage) there will be induced a negative surface charge density and that on a portion of the patterning device MA which overlaps the second electrode 56 there will be induced a generally equal and opposite positive surface charge density. Any negative charges disposed between the second electrode 56 and the patterning device MA (for example entrained in the gas flow) will therefore tend to be biased away from the second electrode 56 and towards the patterning device MA. However, the second electrode 56 is disposed such that it overlaps the non-image forming portion 22 of the patterning device MA. Therefore, although such particles are urged towards the patterning device MA, they are urged towards the non-image forming portion 22 of the patterning device MA and will therefore not affect the image formed on the substrate W.

Any negative charges disposed adjacent to the patterning device MA (for example entrained in the gas flow) which are not between the first electrode 54 and the patterning device MA or between the second electrode 56 and the patterning device MA will also tend to be biased away from the patterning device MA, since it is maintained at a negative intermediate voltage (provided that it is sufficiently far from the region of patterning device MA which overlaps with the second electrode 56 on which the negative charge density is induced).

Therefore, the above described patterning device conditioning system is advantageous because the gas supply module can provide a flow of gas 52 which can act to transport particles away from the patterning device MA. At the same time, the biasing module is arranged to generally bias negatively charged particles entrained in this gas flow 52 away from all parts of the patterning device MA except for a portion of the non-imaging portion 22 of the patterning device MA.

The voltage supply 58 may be configured such that the first, positive voltage and the second, negative voltage are such that a magnitude of the voltage of the patterning device MA is less than 50 V. For example, the applied voltages may such that the voltage of the patterning device MA is less than 20 V, for example of the order of 10 V.

Maintaining the voltage of the patterning device MA at a relatively small but negative voltage may provide a beneficial biasing of negatively charged particles away from the image formation portion 20 of the patterning device MA whilst reducing the level of currents through (relatively thin) conductive film on patterning device MA. Advantageously, this can reduce heating and/or damage of the patterning device MA. Furthermore, once the voltages are removed from the first and second electrodes, the biasing voltage that has been induced on the patterning device MA may remain. By keeping this voltage low (for example below 50 V) the chances of this voltage arcing or shorting with other metal components is reduced.

It will be appreciated that the first and second electrodes 54, 56 (shown rather schematically in FIGS. 6A and 6B) may be provided in any convenient positions, provided that the second electrode 56 (on which the negative charge density is induced) does not overlap the image forming portion 20 of the patterning device. Either of the first and second electrodes may be provided by a plurality of electrodes. The first and second electrodes may be provided in substantially the same plane or in different planes which are different distances from the patterning device MA (as in FIGS. 6A and 6B).

It will be appreciated that for embodiments which comprise a scanning module and wherein, in use, the support structure MT and patterning device MA move in a scanning direction, the second electrode 56 may be disposed such that it always overlaps the non-imaging portion 22 of the patterning device MA and does not overlap the image forming portion 20 of patterning device MA for the entire range of positions between the first end position and the second end position. That is, the second electrode may be disposed such that it at least partially overlaps the non-image forming portion 22 of the patterning device MA and does not overlap the image forming portion 20 of the patterning device MA when the support structure MT is disposed in the first end position, the second end position or any position therebetween. In practice, this may be achieved using multiple second electrodes. The voltages of such multiple second electrodes may, for example, be controlled in dependence on a position of the patterning device MA.

In some embodiments, the second electrode is provided on one or both of the two x masking blades 32, 34. Advantageously, these overlap the patterning device MA through the entire range of positions between the first end position and the second end position and, in particular, overlap the non-image forming portion 22 of the patterning device MA.

Optionally, the first electrode 54 may be is disposed such that it at least partially overlaps the image forming portion 20 of the patterning device MA. Such an arrangement may, for example, be used for embodiments comprising a scanning module operable to move the support structure MT, as described above, since for such scanning arrangements there is always at least part of the image forming portion 20 of the patterning device MA which is not receiving the radiation beam B. The first electrode 54 may be disposed such that it at least partially overlaps the image forming portion 20 of the patterning device MA for at least part of the range of positions between the first end position and the second end position. The first electrode 54 may be disposed such that it at least partially overlaps the image forming portion 20 of the patterning device MA for the entire range of positions between the first end position and the second end position. In practice, this may be achieved using multiple first electrodes. The voltages of such multiple first electrodes may, for example, be controlled in dependence on a position of the patterning device MA.

In some embodiments, the first electrode may comprise one or more electrodes provided on any components that overlap the image forming portion 20 of the patterning device MA for at least part of the range of scanning positions between the first and second end positions. For example, first electrodes may be provided on the y masking blades 38, 38 and/or the gas nozzle 50.

In general, for embodiments comprising a scanning module operable to move the support structure MT, as described above, the first electrode 54 may comprise one or more electrodes disposed so as to overlap within the extended first portion region 28 of the support structure MT (see FIGS. 3A and 3B) and the second electrode 56 may comprise one or more electrodes disposed so as to overlap within two extended non-critical regions 30a, 30b of the support structure MT (see FIGS. 3A and 3B).

In some embodiments, the patterning device MA may be provided with a pellicle assembly 65. Such a pellicle assembly may comprise a relatively thin membrane tensioned on a supporting frame. The pellicle assembly is provided over the patterning device MA so as to cover the image forming portion 20. For example, the frame may overlap the non-image forming portion 22 of the patterning device MA and the membrane may overlap the image forming portion 20 of the patterning device MA. For such embodiments, the patterning device conditioning system can modified to provide a scheme whereby the image forming portion 20 of the patterning device MA is negatively biased with respect to the pellicle to create an electrical force on particles from the patterning device MA towards pellicle. It will be appreciated that for embodiments wherein a pellicle is used only the particles which are disposed between the pellicle and the patterning device present a problem for imaging (particles outside of this region cannot impinge on the patterning device MA due to the pellicle).

This can be achieved by placing a negatively biased counter-electrode facing the conductive surface of the patterning device MA outside of the pellicle area (for example extending in the non-scanning direction), and by placing a positively biased counter-electrode facing the pellicle in (for example extending in the scanning direction). That is, no significant change is employed to the positioning or the biasing of the electrodes of the patterning device conditioning system to be adapted for use with pellicles. The pellicle effectively provides an effective first electrode which is maintained at a positive bias by an actual first electrode. Advantageously, the effective first electrode formed by the pellicle can cover the entire image forming portion 20 of the patterning device MA for the entire range of scanning positions (as the pellicle moves with the patterning device MA). However, it will be appreciated that the overlap between the actual electrode (which applies the voltage to the pellicle via a capacitive coupling) and the pellicle may vary over the range of scanning positions of the patterning device MA.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

CLAUSES

Clause 1. A patterning device conditioning system for a lithographic apparatus, the patterning device conditioning system comprising: a support structure for supporting a patterning device, the support structure comprising a first portion for supporting an image forming portion of the patterning device and a second portion for supporting a non-image forming portion of the patterning device; a gas supply module operable to provide a flow of gas adjacent to the support structure; and a biasing module for controlling an electrical potential of a patterning device when supported by the support structure, the biasing module comprising a first electrode, a second electrode and a voltage supply; wherein the first and second electrodes are each spaced apart from and facing the support structure so as to at least partially overlap with the support structure; wherein the voltage supply is arranged to maintain the first electrode at a first, positive voltage, and to maintain the second electrode at a second, negative voltage; wherein the second electrode is disposed such that it at least partially overlaps the second portion of the support structure and does not overlap the first portion of the support structure.

Clause 2. The patterning device conditioning system of clause 1 wherein the first, positive voltage and the second, negative voltage are such that the voltage of the patterning device is negative.

Clause 3. The patterning device conditioning system of clause 1 or clause 2 further comprising a scanning module operable to move the support structure in a scanning direction between at least a first end position and a second end position.

Clause 4. The patterning device conditioning system of any preceding clause wherein the second electrode is disposed such that it at least partially overlaps the second portion of the support structure and does not overlap the first portion of the support structure when the support structure is disposed in the first end position, the second end position or any position therebetween.

Clause 5. The patterning device conditioning system of any preceding clause wherein the first electrode is disposed such that it at least partially overlaps the first portion of the support structure.

Clause 6. The patterning device conditioning system of any preceding clause wherein the first electrode comprises a plurality of first electrode elements.

Clause 7. The patterning device conditioning system of clause 6 when dependent either directly or indirectly on clause 3 wherein the first electrode elements are arranged such that for any position in a range of positions between the first end position and the second end position at least one of the first electrode elements at least partially overlaps the support structure.

Clause 8. The patterning device conditioning system of clause 7 wherein the at least one of the first electrode elements at least partially overlaps the first portion of the support structure.

Clause 9. The patterning device conditioning system of clause 6 when dependent either directly or indirectly on clause 3 wherein the voltage supply is arranged to control a voltage of each of the first electrode elements in dependence on a position of the support structure.

Clause 10. The patterning device conditioning system of any preceding clause wherein the second electrode comprises a plurality of second electrode elements, wherein each of the second electrode elements is disposed such that it at least partially overlaps the second portion of the support structure and does not overlap the first portion of the support structure.

Clause 11. The patterning device conditioning system of clause 10 when dependent either directly or indirectly on clause 2 wherein the second electrode comprises two second electrode elements, each of the second electrode elements extending in a non-scanning direction which is perpendicular to the scanning direction.

Clause 12. The patterning device conditioning system of clause 10 or clause 11 when dependent either directly or indirectly on clause 3 wherein the voltage supply is arranged to control a voltage of each of the second electrode elements in dependence on a position of the support structure.

Clause 13. The patterning device conditioning system of any preceding clause wherein the first, positive voltage and the second, negative voltage are such that a magnitude of the voltage of the patterning device is less than 50 V.

Clause 14. The patterning device conditioning system of any preceding clause wherein one or more of the first and second electrodes is provided on a patterning device masking blade, an edge of the patterning device masking blades defining a portion of a perimeter of a field region on the patterning device.

Clause 15. The patterning device conditioning system of any preceding clause wherein one or more of the first and second electrodes is provided on a portion of the gas supply module.

Clause 16. An assembly comprising: the patterning device conditioning system of any preceding clause; and a patterning device supported by the support structure.

Clause 17. The assembly of clause 16 wherein the patterning device is provided with a pellicle.

Clause 18. A lithographic apparatus comprising: an illumination system operable to output a radiation beam; the patterning device conditioning system of any one of clause 1 to 15, wherein the radiation beam output by the illumination system is directed to the support structure so that a patterning device supported by the support structure can impart a pattern in the cross-section of the radiation beam, forming a patterned radiation beam; a substrate table for supporting a substrate; and a projection system for projecting the patterned radiation beam onto a target region of the substrate so as to form an image on the substrate.

Clause 19. A method for conditioning a patterning device within a lithographic apparatus, the method comprising: supporting the patterning device; providing a flow of gas adjacent to the patterning device; providing first and second electrodes that are each spaced apart from and facing the patterning device so as to at least partially overlap with the patterning device wherein the second electrode is disposed such that it at least partially overlaps a non-image forming portion of the patterning device and does not overlap an imaging portion of the patterning device; and maintaining the first electrode at a first, positive voltage and maintaining the second electrode at a second, negative voltage such that the voltage of the patterning device is negative.

Clause 20. A method for conditioning a patterning device having a pellicle assembly within a lithographic apparatus, the method comprising: supporting the patterning device; providing a flow of gas adjacent to the patterning device; providing first and second electrodes that are each spaced apart from and facing the patterning device so as to at least partially overlap with the patterning device wherein the second electrode is disposed such that it at least partially overlaps a portion of the patterning device and does not overlap the pellicle assembly and wherein the first electrode is disposed such that it at least partially overlaps the pellicle assembly; and maintaining the first electrode at a first, positive voltage and maintaining the second electrode at a second, negative voltage such that the voltage of the patterning device is negative and a voltage of the pellicle is positive.

Clause 21. The method of clause 19 or clause 20 further comprising moving the support structure in a scanning direction between at least a first end position and a second end position.

Clause 22. The method of clause 21 wherein the first, positive voltage and/or the second, negative voltage the voltage supply is controlled in dependence on a position of the patterning device.

Clause 23. The method of any one of clauses 19 to 22 wherein at least part of the method is carried our using the patterning device conditioning system of any one of clauses 1 to 15.

The invention claimed is:

1. A patterning device conditioning system for a lithographic apparatus, the patterning device conditioning system comprising:
   a support structure configured to support a patterning device, the patterning device comprising an image forming portion capable to pattern radiation to form a device pattern when radiation is incident on the image forming portion and a non-image forming portion incapable of patterning radiation to form the device pattern when radiation is incident on the non-image forming portion;
a gas supply module configured to provide a flow of gas adjacent to the support structure; and
a biasing module configured to control an electrical potential of the patterning device when supported by the support structure, the biasing module comprising a first electrode, a second electrode and a voltage supply, wherein the first and second electrodes are each spaced apart from and facing the support structure so as to at least partially overlap with the support structure,
wherein the voltage supply is arranged to maintain the first electrode at a first, positive voltage, and to maintain the second electrode at a second, negative voltage, and
wherein the second electrode is disposed such that it at least partially overlaps a portion of the support structure that overlaps the non-image forming portion and does not overlap the imaging portion of the patterning device when supported by the support structure.

2. The patterning device conditioning system of claim 1, wherein the first, positive voltage and the second, negative voltage are such that the voltage of the patterning device is negative.

3. The patterning device conditioning system of claim 1, further comprising a scanning module configured to move the support structure in a scanning direction between at least a first end position and a second end position.

4. The patterning device conditioning system of claim 3, wherein the second electrode is disposed such that it at least partially overlaps the portion of the support structure and does not overlap the imaging portion of the patterning device when supported by the support structure when the support structure is disposed in the first end position, the second end position or any position therebetween.

5. The patterning device conditioning system of claim 1, wherein the first electrode is disposed such that it at least partially overlaps the imaging portion of the patterning device when supported by the support structure.

6. The patterning device conditioning system of claim 1, wherein the first electrode comprises a plurality of first electrode elements.

7. The patterning device conditioning system of claim 6, wherein the first electrode elements are arranged such that for any position in a range of positions between a first end position of a scanning motion of the support structure and a second end position of the scanning motion at least one of the first electrode elements at least partially overlaps the support structure.

8. The patterning device conditioning system of claim 7, wherein the at least one of the first electrode elements at least partially overlaps the imaging portion of the patterning device when supported by the support structure.

9. The patterning device conditioning system of claim 6, wherein the voltage supply is arranged to control a voltage of each of the first electrode elements in dependence on a position of the support structure in a movement of the support structure.

10. The patterning device conditioning system of claim 1, wherein the second electrode comprises a plurality of second electrode elements, wherein each of the second electrode elements is disposed such that it at least partially overlaps the portion of the support structure and does not overlap the imaging first portion of the patterning device when supported by the support structure.

11. The patterning device conditioning system of claim 10, wherein the second electrode comprises at least two second electrode elements, each of the at least two second electrode elements extending in a non-scanning direction which is perpendicular to a scanning direction of scanning motion of the support structure.

12. The patterning device conditioning system of claim 10, wherein the voltage supply is arranged to control a voltage of each of the second electrode elements in dependence on a position of the support structure in a movement of the support structure.

13. The patterning device conditioning system of claim 1, wherein the first, positive voltage and the second, negative voltage are such that a magnitude of the voltage of the patterning device is less than 50 V.

14. A method for conditioning a patterning device within a lithographic apparatus, the method comprising:
providing a flow of gas adjacent to the patterning device;
providing first and second electrodes that are each spaced apart from and facing the patterning device so as to at least partially overlap with the patterning device wherein the second electrode is disposed such that it at least partially overlaps a non-image forming portion of the patterning device and does not overlap an imaging portion of the patterning device; and
maintaining the first electrode at a first, positive voltage and maintaining the second electrode at a second, negative voltage such that the voltage of the patterning device is negative.

15. The method of claim 14, wherein the first, positive voltage and/or the second, negative voltage is controlled in dependence on a position of the patterning device in a movement of the patterning device.

16. The method of claim 14, wherein the first electrode is disposed such that it at least partially overlaps the imaging portion of the patterning device.

17. The method of claim 14, wherein the first, positive voltage and the second, negative voltage are such that a magnitude of the voltage of the patterning device is less than 50 V.

18. A method for conditioning a patterning device having a pellicle assembly within a lithographic apparatus, the method comprising:
providing a flow of gas adjacent to the patterning device;
providing first and second electrodes that are each spaced apart from and facing the patterning device so as to at least partially overlap with the patterning device wherein the second electrode is disposed such that it at least partially overlaps a portion of the patterning device and does not overlap the pellicle assembly and wherein the first electrode is disposed such that it at least partially overlaps the pellicle assembly; and
maintaining the first electrode at a first, positive voltage and maintaining the second electrode at a second, negative voltage such that the voltage of the patterning device is negative and a voltage of the pellicle is positive.

19. The method of claim 18, further comprising moving the support structure in a scanning direction between at least a first end position and a second end position.

20. The method of claim 18, wherein the first, positive voltage and/or the second, negative voltage is controlled in dependence on a position of the patterning device.

* * * * *